(12) United States Patent
Kim et al.

(10) Patent No.: US 7,551,013 B2
(45) Date of Patent: Jun. 23, 2009

(54) PHASE INTERPOLATION CIRCUIT AND METHOD OF GENERATING PHASE INTERPOLATION SIGNAL

(75) Inventors: Nam-Seog Kim, Suwon-si (KR); Uk-Rae Cho, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 253 days.

(21) Appl. No.: 11/415,919

(22) Filed: May 1, 2006

(65) Prior Publication Data

US 2006/0256205 A1 Nov. 16, 2006

(30) Foreign Application Priority Data

May 10, 2005 (KR) ...................... 10-2005-0038785

(51) Int. Cl.
*H03H 11/16* (2006.01)
*H03K 5/13* (2006.01)

(52) U.S. Cl. .................. 327/231; 327/233; 327/234; 327/235; 327/236; 327/254; 327/255; 327/256

(58) Field of Classification Search ......... 327/231–238, 327/246–253
See application file for complete search history.

(56) References Cited

U.S. PATENT DOCUMENTS 3,737,790 A * 6/1973 Brown ..................... 327/339

| 6,359,486 | B1 | 3/2002 | Chen |
| 6,380,783 | B1 * | 4/2002 | Chao et al. ........... 327/258 |
| 7,075,346 | B1 * | 7/2006 | Hariman et al. ....... 327/116 |
| 7,196,564 | B2 * | 3/2007 | Rajagopal et al. ..... 327/246 |
| 2003/0042957 | A1 | 3/2003 | Tamura |
| 2003/0122588 | A1 | 7/2003 | Glenn |

* cited by examiner

*Primary Examiner*—Kenneth B Wells
*Assistant Examiner*—John W Poos
(74) *Attorney, Agent, or Firm*—F. Chau & Associates, LLC

(57) ABSTRACT

A phase interpolation circuit and method are provided that are capable of operating in a low voltage and capable of generating a substantially exact phase-interpolation signal, where the phase interpolation circuit is configured to output a phase interpolation signal having a phase between phases of at least two input signals and comprises an interpolation unit configured to discharge an output node by a first interpolation control signal in case a first input signal of two input signals having different phases is inputted to the interpolation unit when the output node has been precharged to a power supply voltage level, the interpolation unit additionally discharging the output node by a second interpolation control signal in case of input of a second input signal of the two input signals; a comparison unit for comparing a reference voltage level and a voltage level of the output node of the interpolation unit to output a signal corresponding to the comparison; and a short pulse generation unit for generating a short pulse in response to an output signal of the comparison unit.

16 Claims, 13 Drawing Sheets

PHASE INTERPOLATION CIRCUIT AND METHOD OF GENERATING PHASE INTERPOLATION SIGNAL

CROSS-REFERENCE TO RELATED APPLICATION

This application claims foreign priority, under 35 U.S.C. § 119, to Korean Patent Application No. 10-2005-38785, filed on May 10, 2005, which is herein incorporated by reference in its entirety.

BACKGROUND OF THE INVENTION

1. Technical Field

The present disclosure relates to phase interpolation, and more particularly relates to a phase interpolation circuit and method that is capable of operating in a low voltage and capable of preventing a 3-code dithering.

2. Discussion of Related Art

As semiconductor technology has developed, digital technology for devices such as personal computers, portable digital assistants or mobile communications devices has been similarly developed.

However, despite improvements in data transmission rates and in operation rates of peripheral devices such as memory, communication devices or graphic devices, the operation rate of many peripheral devices is not capable of keeping up with an operation rate of a microprocessor. Thus, there is a rate difference between new microprocessors and their peripheral devices. Accordingly, in high technology digital industries, there is a desire for a significant improvement in operation rates of peripheral devices.

For example, in a method of transmitting data by synchronizing the data with the clock signal, such as the data transmission between a memory device and a memory controller, a bus load becomes large and a transmission frequency becomes high. Accordingly, it is very important to make synchronization between the clock signal and data. For this purpose, there are a phase lock loop (PLL) circuit and a delay lock loop (DLL) circuit.

Generally, the phase lock loop circuit and delay lock loop circuit comprise a phase interpolation circuit. The phase interpolation circuit is a circuit that controls two clock signals having different phases to generate a clock signal between the two clock signals. The phase interpolation circuit is capable of outputting an accurate desired phase that may be applied to various circuits. The delay lock loop circuit is typically used in semiconductor memory devices. An example of a conventional delay lock loop circuit, including a phase interpolation circuit, is shown in FIG. 1.

Referring to FIG. 1, the example of a conventional delay lock loop circuit comprises a reference loop 10, a phase selection unit 20, an interpolation unit 30, a phase detection unit 40 and a control unit 50. The conventional delay lock loop circuit may further comprise a duty cycle correction circuit configured to correct a duty cycle of an output signal of the interpolation unit 30 to obtain the duty cycle with a preset level, such as 50%, for example.

The reference loop 10 generates a plurality of reference clock signals by delaying the exterior clock signal (C, Cb) through a plurality of delay units, which respectively have corresponding delays obtained by uniformly dividing a period (T) of the exterior clock signals (C, Cb) by the number of the delay units.

For example, in case the period (T) of the respective exterior clock signal (C, Cb) is divided by 8, a delay unit delays the exterior clock signal (C, Cb) by T/8. Accordingly, a signal through one delay unit is delayed by T/8, and a signal through two delay units is delayed by T/4, and a signal through n delay units (n is a natural number which is more than one) is delayed by nT/8, compared to the exterior clock signal (C, Cb). Therefore, a plurality of reference clock signals having different delays is outputted.

The phase selection unit 20 includes at least one phase multiplexer (mux) circuit. The phase mux circuits are controlled by selection control signals (SEL) outputted from the control unit 50. Each of the phase mux circuits is configured to select two reference clock signals among the reference clock signals, the two clock signals being the closest and the second closest clock signal to the exterior clock signal (C, Cb), in response to the same selection control signals (SEL) received by the control unit 60.

The interpolation unit 30 includes at least one phase interpolation circuit. The phase interpolation circuit generates a phase interpolation signal having any phase between those of the two reference clock signals, which are selected by the phase selection unit 20, in response to an interpolation control signal (VCNA, VCNB) received by the control unit 60.

The phase detection unit 40 compares phases of the phase interpolation signal and the exterior clock signal (C, Cb), and applies a detection signal (PHADV) corresponding to the difference of the phases to the control unit 60. The control unit 50 includes a Finite State Machine (FSM) circuit having a counter circuit and a D/A converter circuit, and generates the control signals for selection (SEL) and interpolation (VCNA, VCNB) in response to the detection signal (PHADV) received by the phase detection unit 40, thereby controlling the phase selection unit 20 and the interpolation unit 30.

The operation as described above continues until the dithering phenomenon occurs in the phase detection unit 40, and a signal generated in the dithering phenomenon is a phase interpolation signal. This state of the signal generation is called a state of "being locked".

An example of a conventional phase interpolation circuit constituting the interpolation unit of FIG. 1 is disclosed in U.S. Pat. No. 6,359,486. However, the phase interpolation circuit shown in FIG. 6 of U.S. Pat. No. 6,359,486 has a problem as follows. Given a current source controlled by a first control signal (VC) and a current source controlled by a second control signal (VCB), in case either current source is not operated and the other current source is operated, an input signal from the inoperative current source should not affect the output signal. Unfortunately, in a case where a current source controlled by the first control signal VC is not operative, the first input signal ($\Phi 0$) affects the output signal (OUT, OUTB) by a capacitive coupling of a transistor to which the first input signal is inputted, thereby making an error of phase shift. In addition, in a case where the load comprises a transfer gate circuit and the current source for constituting a unit cell comprises a transistor, 4 transistors are connected in series, thereby increasing the number of transistors that operate in saturation and making a problem where operation at a low voltage has a limitation.

FIG. 2 is a circuit diagram illustrating another phase interpolation circuit according to the conventional art. This conventional phase interpolation circuit includes loads (L1, L2), transistors (NM1-NM4, N1-N6), and has a connection structure as shown in FIG. 2.

The phase interpolation circuit of FIG. 2 operates to isolate input signals and output signals by arranging the transistors (NM1-NM4) for operating as current sources between output nodes (OUT, OUTb) and the transistors (N1-N4), which receive input signals (S1, S1b, S2, S2b).

This circuit does not show the capacitive coupling effect of the phase interpolation circuit shown in FIG. 6 of U.S. Pat. No. 6,359,486. However, it has a large size layout and a varying total load, thereby making the phase shift nonlinear. In addition, 4 transistors are connected in series, thereby increasing the number of transistors that operate in saturation areas, still making the problem where an operation of the circuit in a low voltage has a limitation.

FIG. 3 is a graph for showing a 3-code dithering phenomenon which is another problem resulting from the conventional phase interpolation circuit. FIG. 3 shows a change of phase according to time, resulting from the dithering phenomenon in the phase detection unit 40 of FIG. 1.

As shown in FIG. 3 for a digital control method, the phase is discrete and it is not possible to achieve a locking operation without error. It is typical to perform the locking operation when an output signal is dithering between two adjacent phases with reference to a reference phase as shown in a dotted area 12 (i.e. 2 code dithering). However, in case any one of phases is in an uncertain area of the phase detection unit (40 of FIG. 1) or any one of phases exactly corresponds to the reference phase, there is a problem where the output signal is dithering at three phases as shown by a dotted area 14 of FIG. 3 (i.e., 3-code dithering).

SUMMARY OF THE INVENTION

An aspect of the present disclosure provides a phase interpolation circuit and a method of generating a phase interpolation signal.

Another aspect of the present disclosure provides a phase interpolation circuit and a method of generating a phase interpolation signal, capable of operating even in a low voltage.

Other aspects of the present disclosure provide a phase interpolation circuit and a method of generating a phase interpolation signal, capable of preventing or minimizing an error of phase shift.

Further aspects of the present disclosure provide a phase interpolation circuit and a method of generating a phase interpolation signal, capable of overcoming problems resulting from 3-code dithering.

According to one exemplary embodiment of the present disclosure, there is provided a phase interpolation circuit, which is configured to output a phase interpolation signal having a phase between phases of at least two input signals, comprising: an interpolation unit configured to discharge an output node by a first interpolation control signal in case a first input signal of two input signals having different phases is inputted to the interpolation unit when the output node has been precharged to a power supply voltage level, the interpolation unit additionally discharging the output node by a second interpolation control signal in case of input of a second input signal of the two input signals; a comparison unit for comparing a reference voltage level and a voltage level of the output node of the interpolation unit to output a signal corresponding to the comparison; and a short pulse generation unit for generating a short pulse in response to an output signal of the comparison unit.

The first interpolation control signal and the second interpolation control signal vary in inverse proportion to each other. The interpolation unit comprises a precharge unit for precharging the output node to a power supply voltage level in case the first input signal or the second input signal is not applied; a first current source unit driven by a first interpolation control signal to discharge the output node when the first input signal is applied; and a second current source unit driven by a second interpolation control signal to discharge the output node when the second input signal is applied.

Further, the first current source unit comprises two serial transistors connected between the output node and a ground terminal; and one transistor of the two transistors which is connected to the output node operates as a current source driven by a first interpolation control signal, and the other transistor of the two transistors which is connected to the ground terminal operates when the first input signal is applied, thereby operating as a switch of the current source. The second current source unit is connected to the first current source unit in parallel, and the second current source unit comprises two serial transistors between the output node and the ground terminal, and one transistor of the two transistors which is connected to the output node operates as a current source driven by a second interpolation control signal, and the other transistor of the two transistors which is connected to the ground terminal operates as a switch of the current source when the second input signal is applied.

The phase interpolation circuit further comprises a D/A converter circuit for generating the first interpolation control signal and the second interpolation control signal in response to control code signals. The D/A converter comprises: a load unit configured to uniformly divide the total current into several sub currents by a plurality of current control devices through which currents of the same value flow, and configured to select a predetermined number of the plurality of current control devices by the switching devices for responding to a first control code signal among the control code signals, thereby controlling current flowing through a first node, and configured to select current control devices which are not selected by the first control code signal, by the plurality of switching devices for responding to the second control code signal, which is a complementary signal to the first control code signal, thereby controlling current flowing through a second node; and a signal generation unit comprising a first interpolation control signal generation unit for generating the first interpolation control signal corresponding to current flowing through the first node, and a second interpolation control signal generation unit for generating the second interpolation control signal corresponding to current flowing through the second node.

The first interpolation control signal generation unit of the signal generation unit of the D/A converter and the first current source unit of the interpolation unit constitutes a current mirror circuit; and the second interpolation control signal generation unit and the second current source unit of the interpolation unit constitutes a current mirror circuit. The phase interpolation circuit further comprises a 3-code dithering detection circuit for detecting a 3-code dithering to generate a dithering detection signal.

The phase interpolation circuit further comprises a dithering control circuit configured to respond to the dithering detection signal generated by the 3-code dithering detection circuit, and configured to control current amounts of the first node and the second node to be smaller valued than current flowing through any one of the current control devices of the D/A converter circuit, thereby controlling the first interpolation control signal and the second interpolation control signal.

According to another exemplary embodiment of the present disclosure, there is provided a method for generating a phase interpolation signal having a phase between phases of at least two input signals that comprises steps of: precharging a node to a power supply voltage level when the input signals are not inputted; discharging the node through a first current source for controlling current by a first interpolation control signal in case a first input signal of the two input signals is inputted to the interpolation unit, and discharging the node through the first current source and a second current source for controlling current by a second interpolation control signal in case of input of a second input signal of the two input signals; and comparing a reference voltage level and a voltage level of the node to generate a corresponding short pulse, thereby generating an interpolation signal.

The short pulse is generated in case the voltage level of the node is not higher than the reference voltage level. A sum of a current amount of the first current source and a current amount of the second current source is a uniform amount.

Further, the method further comprises a step of detecting a 3-code dithering to generate a corresponding dithering detection signal. The method further comprises a step of controlling a discharge time of the node and changing a phase of an output signal of the node by responding to a dithering detection signal to control the first interpolation control signal and the second interpolation control signal and to change current amounts of the first current source and the second current source. According to the structure of the circuit, it is possible to generate a phase interpolation signal having an exact phase.

BRIEF DESCRIPTION OF THE DRAWINGS

The above and other features of the present disclosure will become more apparent to those of ordinary skill in the pertinent art by describing in detail preferred embodiments thereof with reference to the attached drawings, in which preferred embodiments of the disclosure are shown. However, the invention should not be construed as limited to only the embodiments set forth herein. Rather, these embodiments are presented as teaching examples. In the drawings, like reference numbers or characters may refer to like elements, and.

DETAILED DESCRIPTION OF PREFERRED EMBODIMENTS

Figure 4:
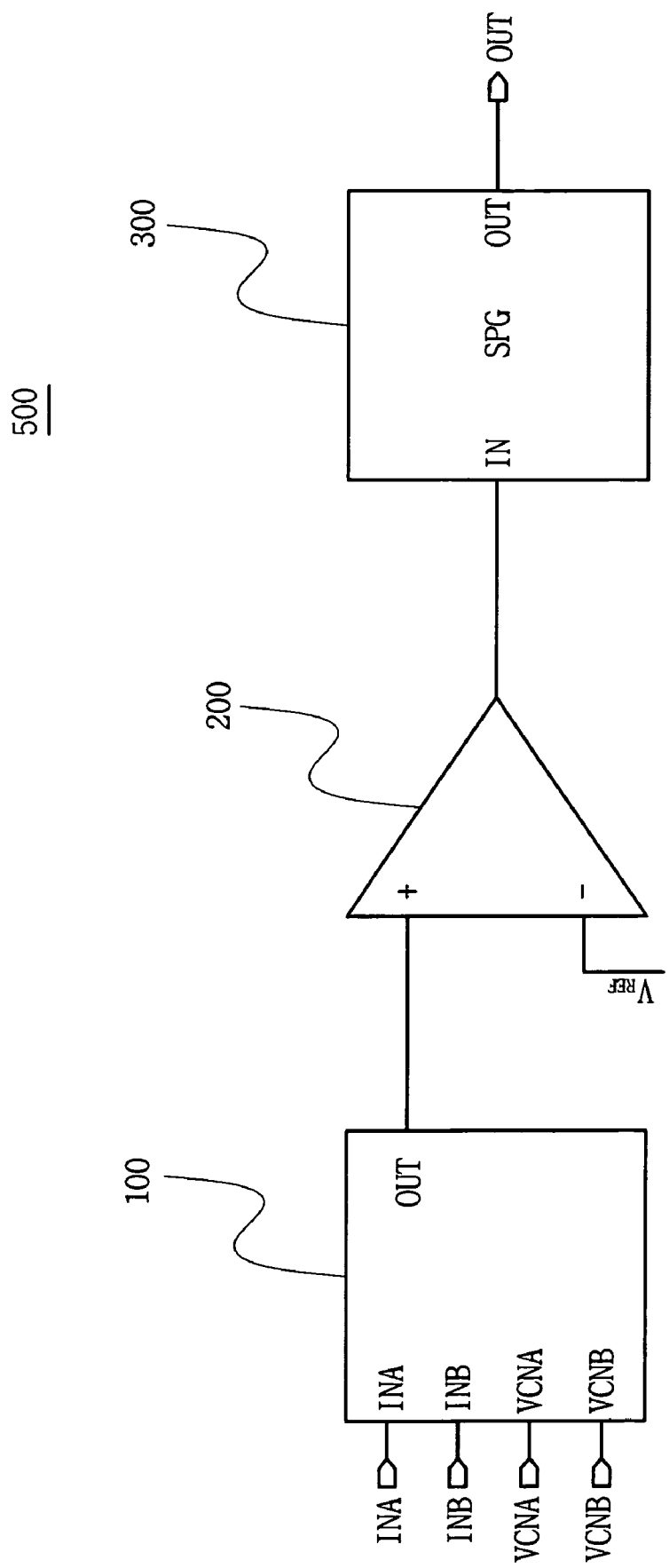
FIG. 4 is a block diagram of a phase interpolation circuit according to an exemplary embodiment of the present disclosure.

FIG. 4 is a block diagram of a phase interpolation circuit according to an embodiment of the present disclosure. Referring to FIG. 4, a phase interpolation circuit 500, according to an exemplary embodiment of the present disclosure, includes an interpolation unit 100, a comparison unit 200, and a short pulse generation unit 300.

An output node (OUT) is precharged to a power supply voltage level VDD, and the interpolation unit 100 discharges the output node (OUT) by a first interpolation control signal (VCNA) when a first input signal (INA) of two input signals (INA, INB) having different phases is inputted thereto. Then, the interpolation unit 100 discharges the output node (OUT) by a second interpolation control signal (VCNB) when a second input signal (INB), which is the other input signal of the two input signals (INA, INB), is inputted to the unit. The first interpolation control signal (VCNA) and the second interpolation control signal (VCNB) may be outputted from a D/A converter constituting the control unit 50 of FIG. 1, and these control signals may be signals that vary in inverse proportion to each other.

The comparison unit 200 compares a reference voltage level ($V_{REF}$) and a voltage level of the output node (OUT) of the interpolation unit 100 to output a signal corresponding to the comparison. For example, the comparison unit 200 outputs a logical low signal in cases where the voltage level of an output signal of the interpolation unit 100 is not more than the reference voltage level ($V_{REF}$). Otherwise, the comparison unit 200 outputs a logical high signal.

The short pulse generation unit 300 generates a short pulse in response to an output signal of the comparison unit 200. For example, the short pulse is generated in case the output signal of the comparison unit 200 is logically low.

Figure 5:
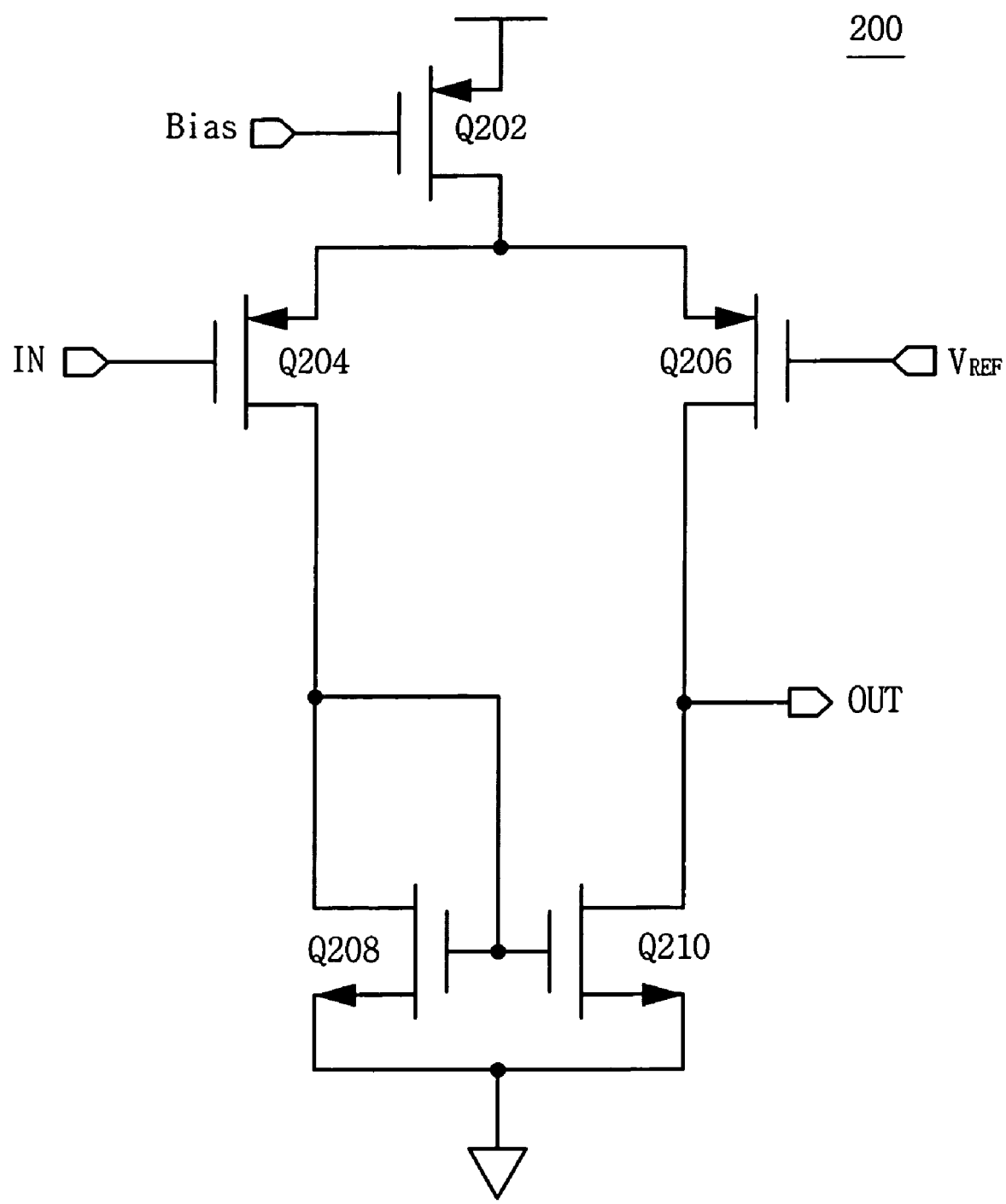
FIG. 5 is a circuit diagram illustrating an exemplary embodiment of the comparison unit of FIG. 4.

FIG. 5 is a view illustrating an exemplary embodiment of the comparison unit 200 of FIG. 4. The comparison unit 200 includes a plurality of transistors (Q202, Q204, Q206, Q208, Q210), and this unit has a connection structure as shown in FIG. 5. The comparison unit 200 compares a level of an input signal (IN) and the reference level ($V_{REF}$) to output a corresponding signal, and this unit has a general current mirror type differential amplifier structure. For example, the comparison unit is configured to output a logical low signal in case the input signal (IN) is not higher than the reference level ($V_{REF}$). The comparison unit 200 may have a different circuit structure from the one described above.

Figure 6:
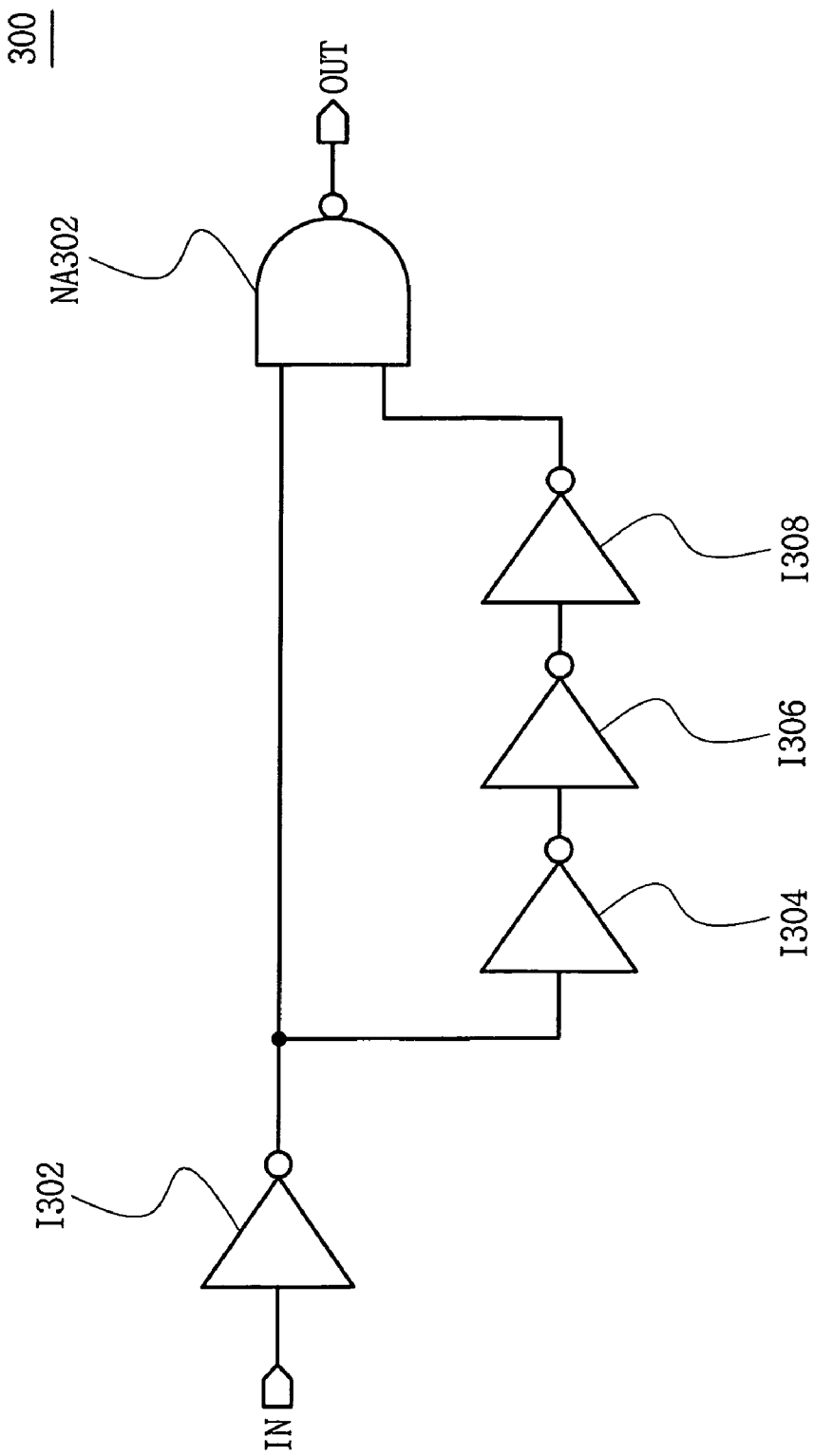
FIG. 6 is a circuit diagram illustrating an exemplary embodiment of a short pulse generation unit of FIG. 4.

FIG. 6 is a view of illustrating an exemplary embodiment of a short pulse generation unit 300. As shown in FIG. 6, the short pulse generation unit 300 comprises a first inverter I302 for inverting an input signal IN; three serial inverters I304, I306, I308 for inverting an output signal of the first inverter I302 to delay the inverted signal; and a logical NAND circuit NA302 for performing a logical NAND operation on the delayed signal from the three inverters and the output signal of the first inverter I302.

In the short pulse generation unit 300, when an input signal (IN) is switched from a logical high to a logical low level, the NAND circuit NA302 has a logically low level for a short time corresponding to a delay between two signals inputted to the NAND circuit NA302, thereby generating a short pulse. Whenever the input signal (IN) is switched from a logical high to a logical low level, this short pulse is generated to be a clock signal and also a phase interpolation signal.

Figure 7:
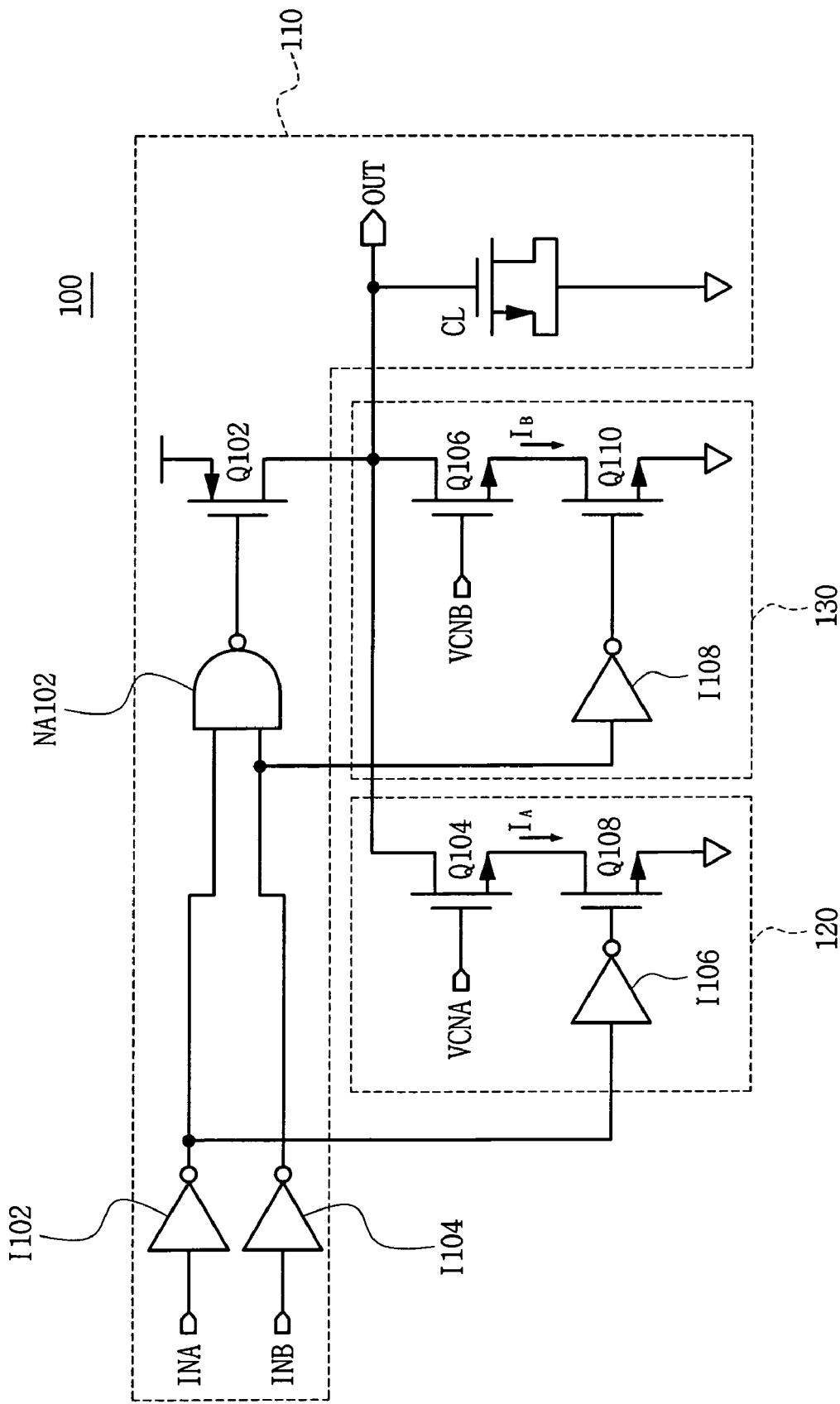
FIG. 7 is a circuit diagram showing an exemplary embodiment of the interpolation unit of FIG. 4.

FIG. 7 is a circuit diagram for showing an exemplary embodiment of the interpolation unit 100 of FIG. 4. Referring to FIG. 7, the interpolation unit 100 comprises a precharge unit 110, a first current source unit 120 and a second current source unit 130.

The precharge unit 110 is a unit for precharging the output node OUT to a power supply voltage level VDD in case the first input signal INA and the second input signal INB is not applied thereto. The precharge unit 110 comprises a first inverter I102 for inverting the first input signal INA; a second inverter I104 for inverting the second input signal INB; a NAND circuit NA102 for performing a logical operation on an output of the first inverter I102 and an output of the second inverter I104. The precharge unit 110 further comprises a transistor Q102 positioned between a terminal of a power supply voltage and the output node OUT, the transistor driven by an output signal of the NAND circuit NA102; and a capacitive load CL positioned between the output node OUT and the ground terminal.

The first current source unit 120 comprises two transistors Q104, Q108. The transistor Q104 is connected to the output node OUT to be driven by an interpolation control signal VCNA to operate as a current source. The transistor Q108 is positioned between the transistor Q104 and the ground terminal to be driven by a buffering signal of the first input signal INA, thereby operating as a switch of the first current source unit 120.

The second current source unit 130 comprises two transistors, Q106 and Q110, arranged in parallel with the first current source unit 120. The transistor Q106 is connected to the output node OUT to be driven by a second interpolation control signal VCNB to operate as a current source. The transistor Q110 is positioned between the transistor Q106 and the ground terminal to be driven by a buffering signal of the second input signal INB, thereby operating as a switch of the first current source unit 130.

In the phase interpolation circuit 500 according to an embodiment of the present disclosure, the current source Q104 or Q106 is arranged between the input and the output, thereby eliminating a capacitive coupling effect according to the input signal. In addition, the phase interpolation circuit 500 includes the two serial transistors (Q104 and Q108, or Q106 and Q110) for operating in a real operation; and one transistor (Q104 or Q106) for operating in a saturation area, thereby being applied to a circuit that can operate in a low voltage.

Figure 8:
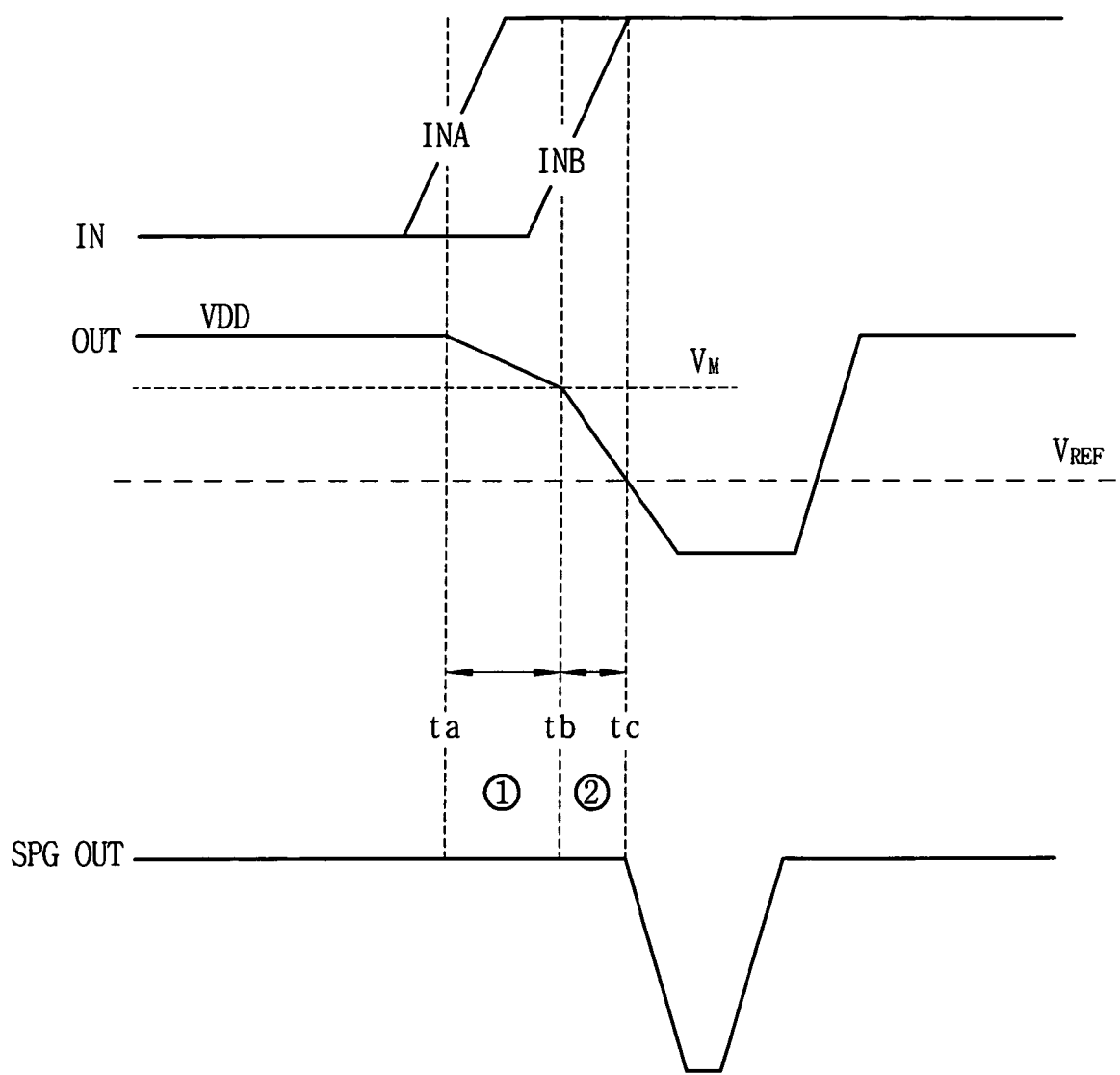
FIG. 8 is a timing diagram showing an exemplary operation of the phase interpolation circuit of FIG. 4.

FIG. 8 is a graph showing an operation timing of the phase interpolation circuit 500 of FIG. 4. Hereinafter, an operation of the phase interpolation circuit will be described with reference to FIGS. 4 through 8.

Before the first input signal INA and the second input signal INB are applied to the circuit, the output node OUT is precharged to a power supply voltage level VDD by the precharge unit 110 of FIG. 7. Thereafter, when the first input signal INA, which has a preceding phase, is inputted, the output node OUT is discharged through the first current source unit 120 with a slope of $-I_A/CL$, at a time point ta when the first input signal is applied. Here, $I_A$ is a current which flows through the first current source unit 120 and has a value of $(1-W)I_s$. Here, $I_s$ is the total current that flows through the first current source unit 120 and the second current source unit 130. W indicates a weight factor of the current source, and is determined by the first interpolation control signal VCNA and the second interpolation control signal VCNB. The discharge only by the first current source unit 120 of the output node OUT continues until an application time point of the second input signal INA. Accordingly, the voltage level of the output node OUT is the power supply voltage level VDD minus a voltage level at a fixed time $I_A/CL*(t-ta)$ which is a discharged value by the first current source unit 120, the voltage level equaling $VDD-I_A/CL*(t-ta)$. Therefore, the voltage level $V_M$ of the output node OUT at an application timing tb of the second input signal INA has a value of $VDD-I_A/CL*(tb-ta)$.

Thereafter, when the second input signal INB is inputted, which has a late-phase relative to the first input signal INA, the output node OUT is discharged simultaneously by the first current source unit 120 and the second current source unit 130. Here, the first current source unit 120 discharges the output node OUT with a slope of $-I_A/C$ because the first input signal INA is being continuously applied, and the second current source unit 130 discharges the output node OUT with a slope of $-I_B/CL$. Here, $I_B$ is current which flows through the second current source unit 130 and has a value of $W*Is$. The total current is the sum of that which flows through the first current source unit 120 and that which flows through the second current source unit 130. W indicates a weight factor of the current source, and is determined by the first interpolation control signal VCNA and the second interpolation control signal VCNB.

Since the output node OUT is simultaneously discharged by the first current source unit 120 and the second current source unit 130 from an application time point tb of the second input signal INB, the output node is discharged with a slope of $-Is/CL$. Accordingly, a voltage level of the output node OUT has a voltage level of $V_M-Is/CL*(t-tb)$, which is the voltage level of $V_M$ at the time point tb minus a voltage at the time point t discharged by the first current source unit 120 and the second current source unit 130, i.e. $Is/CL*(t-tb)$.

At a time point tc when the voltage level of the output node OUT is the same as the reference voltage level of the compare unit 200 $V_{REF}$, a logical low signal is generated by the compare unit 200, and the short pulse generation unit 300 generates a short pulse clock signal (SPG OUT). Here, the capacitor load value CL can be determined by the following Equation 1:

$$CL > T*Is\max/n(VDD-V_{REF})\qquad \text{EQUATION 1}$$

Figure 1:
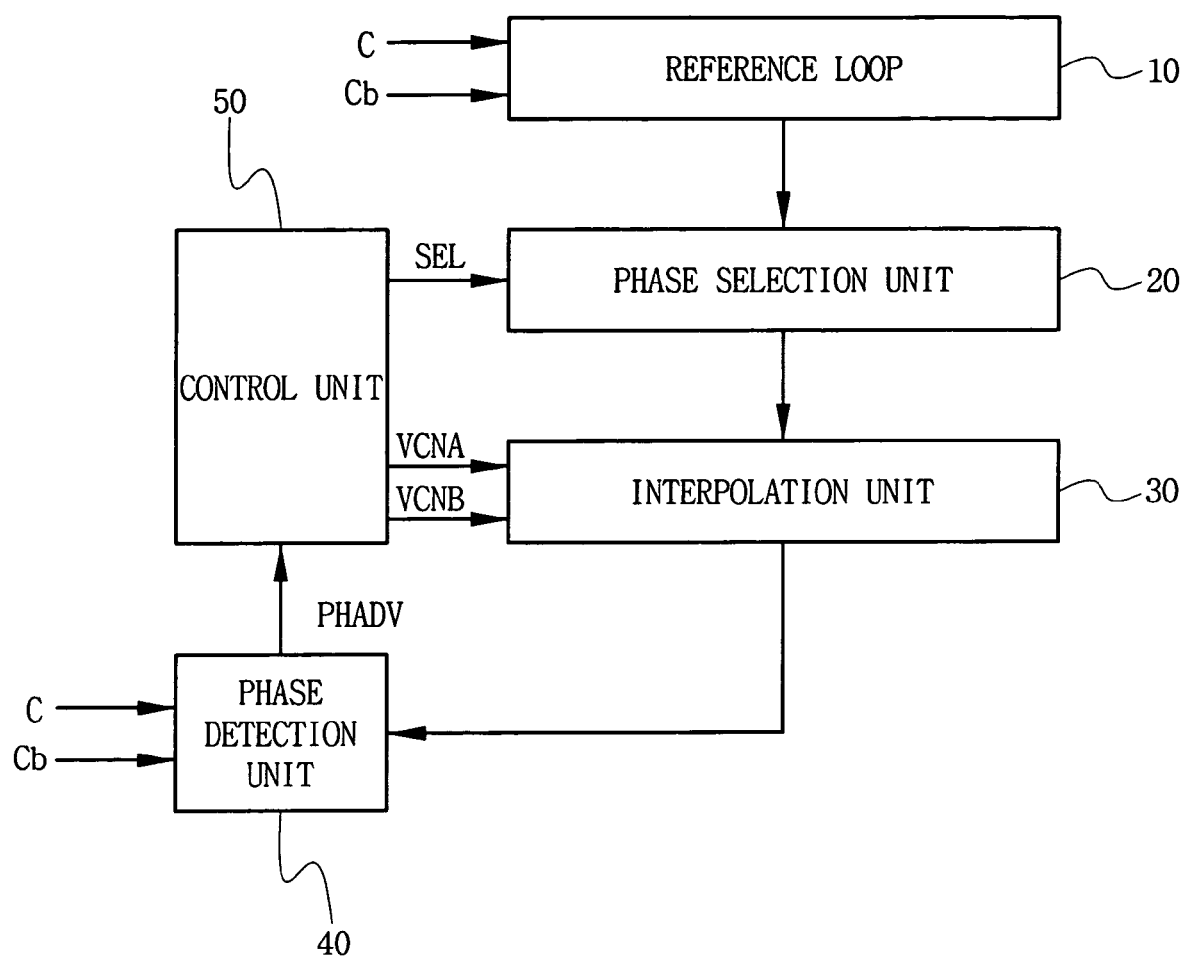
FIG. 1 is a block diagram showing a typical delay lock loop circuit.
Figure 2:
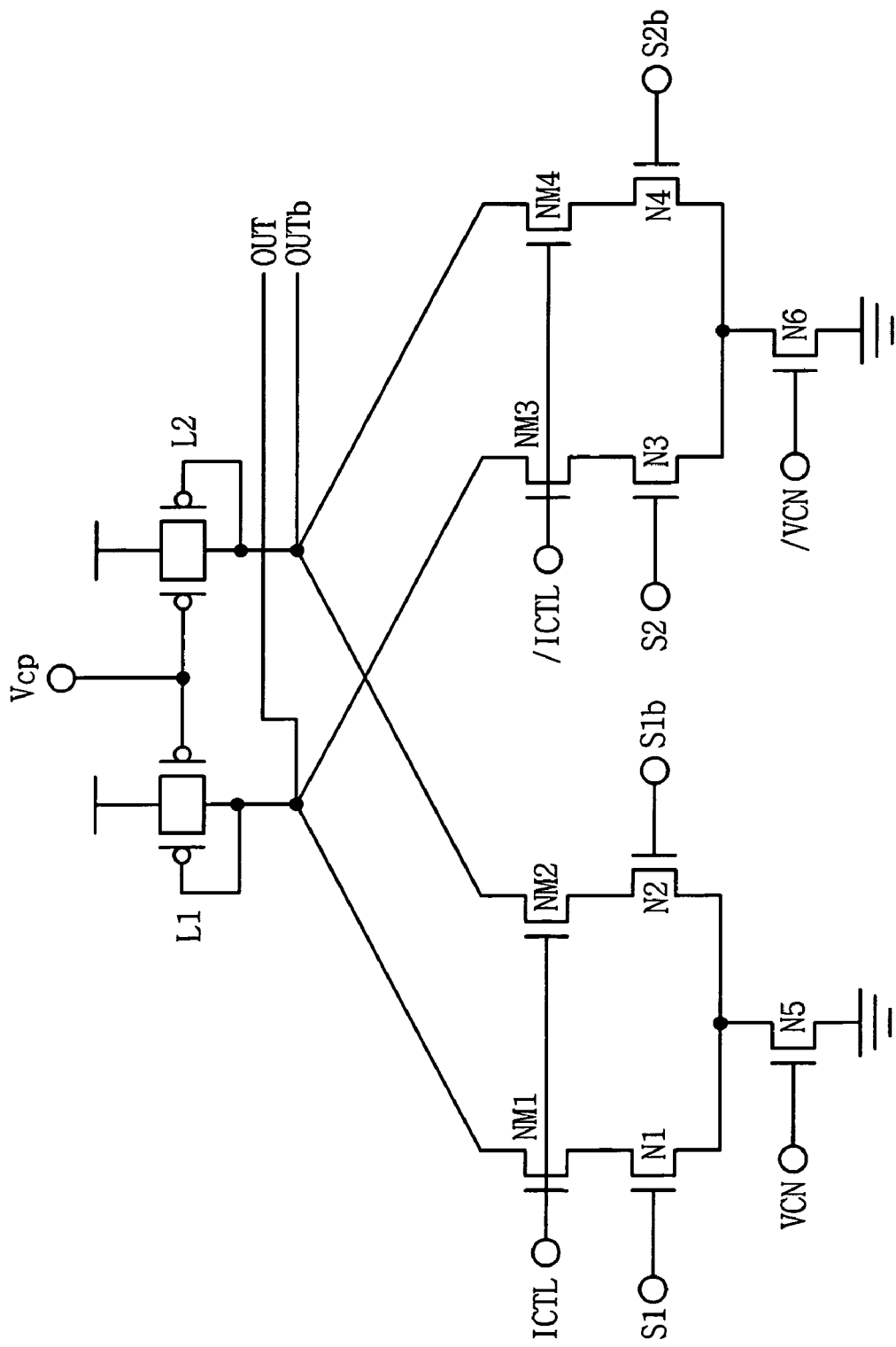
FIG. 2 is a circuit diagram illustrating a phase interpolation circuit according to conventional art.
Figure 3:
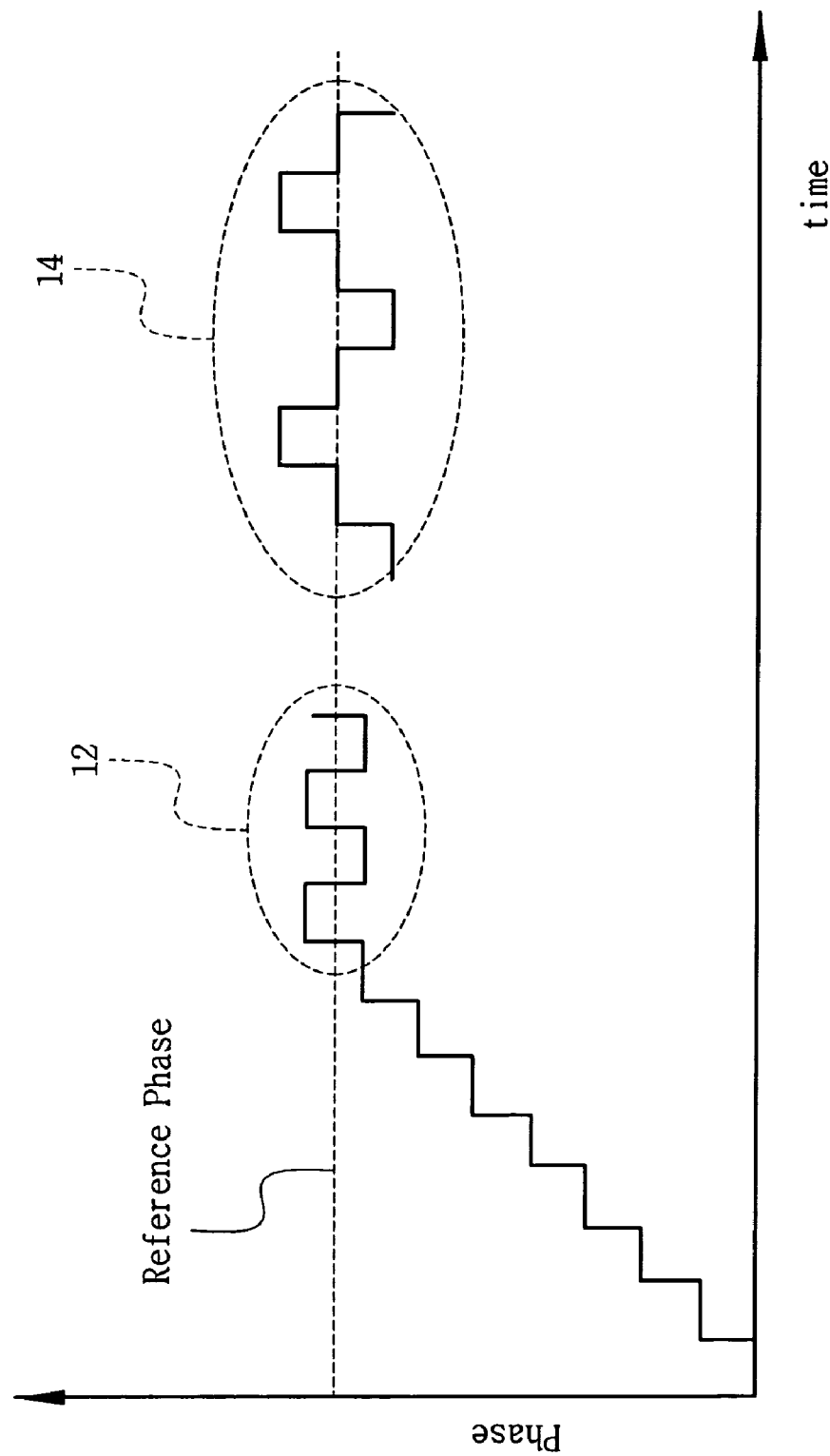
FIG. 3 is a graph showing a phase change of the output signal of the phase detection unit of FIG. 1 according to time in a case of the 3-code dithering phenomenon.

Here, the CL is capacitor load of the interpolation unit, T is a frequency of the input signal, Is.max is a maximum of entire current values of the interpolation circuit, and N is a number of delay units constituting a reference loop of FIG. 1.

According to another exemplary embodiment of the present disclosure, the phase interpolation circuit 500, as described above, further comprises a D/A converter circuit for generating the first interpolation control signal VCNA and the second interpolation control signal VCNB, which control the phase interpolation circuit 500. The D/A converter circuit may be a circuit constituting a control unit 50 of the DLL circuit in FIG. 1. Alternately, in cases where the phase interpolation circuit includes the D/A converter circuit, the control unit 50 of the DLL circuit in FIG. 1 does not include the D/A converter circuit.

Figure 9:
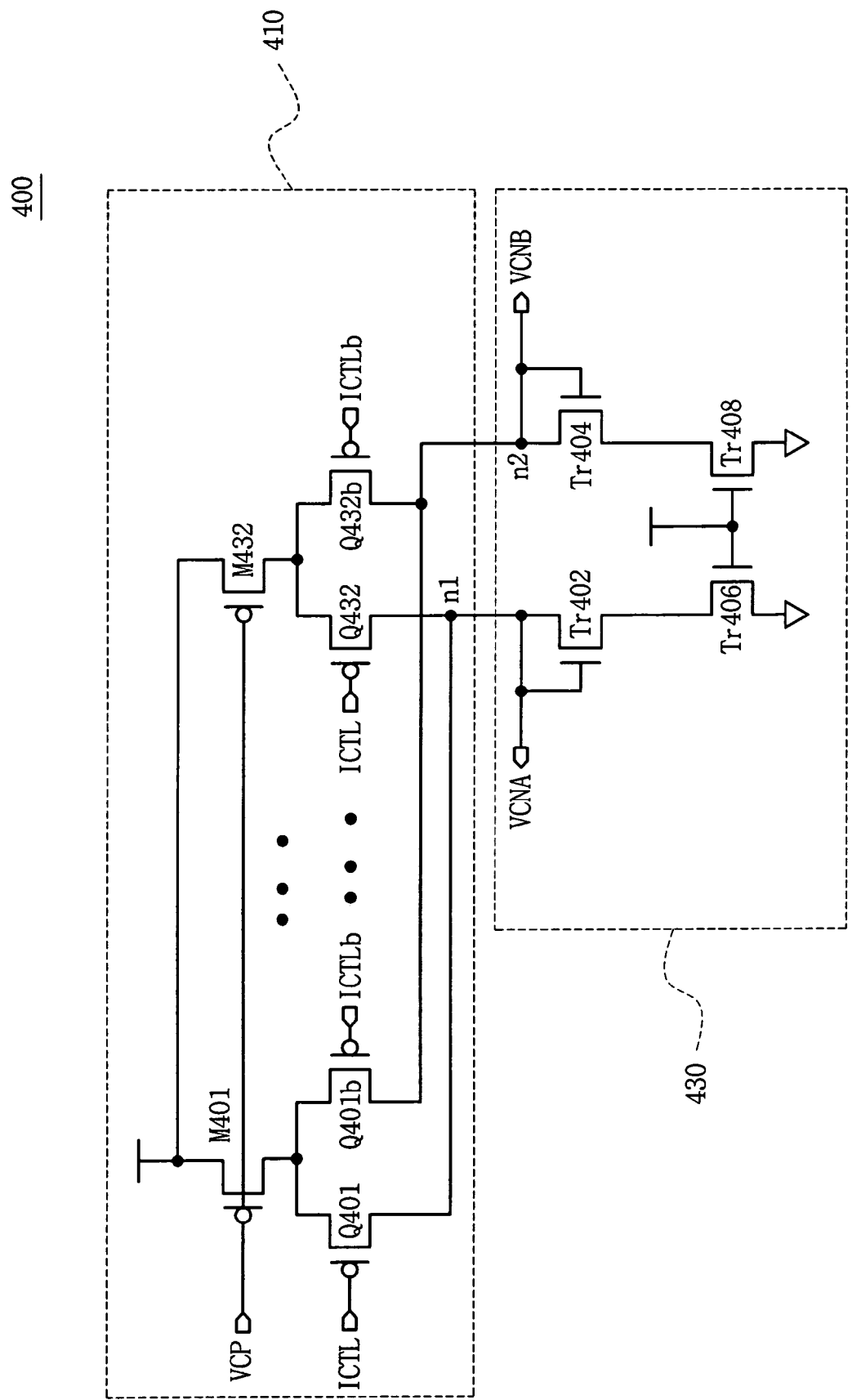
FIG. 9 is a circuit diagram showing an exemplary embodiment of the D/A converter circuit that is added to FIG. 4.

FIG. 9 is a view showing an exemplary embodiment of the D/A converter circuit. Referring to FIG. 9, the D/A converter circuit 400 constituting the interpolation circuit of the present disclosure comprises a load unit 410 and a signal generation unit 430.

The load unit 410 uniformly divides the total current Is into several sub currents (for example 32 sub currents) by current control devices M401-M432, which are controlled by a same control signal VCD. The load unit 410 selects a predetermined number of the current control devices M401-M432, by the switching devices Q401-Q432, for responding to a first control code signal ICTL among control code signals ICTL, ICTLb, thereby controlling current flowing through a first node n1. In addition, the load unit 410 selects current control devices that are not selected by the first control code signal ICTL, by the plurality of switching devices Q401b-Q432b, for responding to the second control code signal ICTLb, which is a complementary signal to the first control code signal ICTL, thereby controlling current flowing through a second node n2. For example, the current control devices are 32 parallel transistors M401-M432, and the unit is configured to allow current through each transistor to be 1/32 times the total current Is by the same control signal VCP. This same control signal for driving the current control devices M401-M432 may be a control signal for driving delay units of the reference loop in FIG. 1.

The number of the plurality of switching devices Q401-Q432 driven by the first control code signal ICTL is the same as the number of the current control devices M401-M432, and the switching devices are respectively connected in series to the current control devices M401-M432. Accordingly, a part of the current control devices (for example, M401-M420) can be selected through the switching devices Q401-Q432 driven by the first control code signal ICTL, and currents flowing through the selected current control devices such as M401-M420 are mixed to be supplied to the signal generation unit 430 through the first node n1.

In addition, the number of the plurality of switching devices Q401b-Q432b driven by the second control code signal ICTLb is the same as the number of the current control devices M401-M432, and the switching devices are respectively connected in series to the current control devices M401-M432. Accordingly, a part of the current control devices (for example, M421-M432) can be selected through the switching devices Q401b-Q432b driven by the second control code signal ICTLb, and currents flowing through the selected current control devices M421-M432 are mixed to be supplied to the signal generation unit 430 through the second node n2.

The signal generation unit 430 comprises a first interpolation control signal generation unit and a second interpolation control signal generation unit. The first interpolation control signal generation unit comprises a transistor Tr402 of a diode structure connected to the first node n1; and a transistor Tr406 having a gate connected to a power supply voltage terminal, the transistor being arranged between the transistor Tr402 and a ground terminal, thereby generating the first interpolation control signal VCNA through the first node n1.

The second interpolation control signal generation unit comprises a transistor Tr404 of a diode structure connected to the second node n2; and a transistor Tr408 having a gate connected to a power supply voltage terminal, the transistor being arranged between the transistor Tr404 and a ground terminal, thereby generating the second interpolation control signal VCNB through the second node n2.

Here, the first interpolation control signal generation unit and the first current source 120 of FIG. 7 controlled by the first interpolation control signal VCNA constitute a current mirror circuit. Accordingly, current through the first current source unit 120 is same as current flowing in the first interpolation control signal generation unit through the first node n1. In addition, the second interpolation control signal generation unit and the second current source 130 of FIG. 7 controlled by the second interpolation control signal VCNB constitutes a current mirror circuit. Accordingly, current through the second current source unit 130 is the same as current flowing in the second interpolation control signal generation unit through the second node n2.

Figure 10:
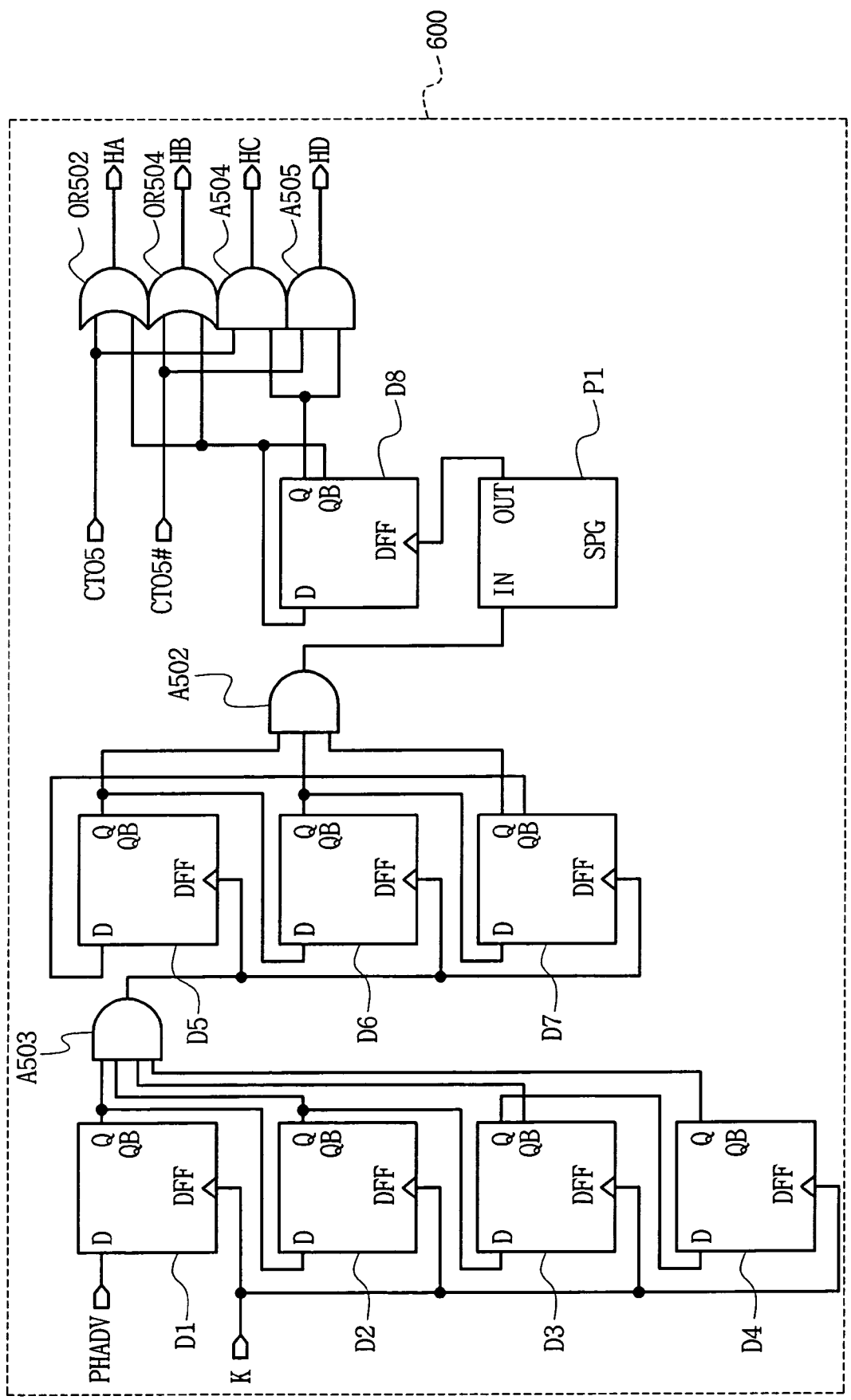
FIG. 10 is a diagram of the circuit for detecting the 3-code dithering.

In still another exemplary embodiment of the present disclosure, the phase interpolation circuit further comprises a 3-code dithering detection circuit and a dithering prevention circuit. FIG. 10 shows the circuit for detecting the 3-code dithering, which occurs in the phase interpolation circuit.

The 3-code dithering detection circuit 600 of FIG. 10 comprises a plurality of flip-flop circuits D1-D8, logical AND circuits A502-A505, logical OR circuits OR502, OR504 and a short pulse generator P1. Various variations may be made to the 3-code dithering detection circuit by those of ordinary skill in the pertinent art.

As shown in FIG. 10, the 3-code dithering detection circuit 600 responds to control signals PHADV, CTO5, CTO5# to generate 3-code dithering detection signals HA, HB, HC, HD. Preferably, the control signal PHADV is a phase detection signal of the phase detection unit 40 in FIG. 1, and the control signal CTO5, CTO5# is a $6^{th}$ bit signal of a counter constituting the control unit 50 in FIG. 1.

Generally, in cases of 2 code dithering, the phase detection unit 40 alternatively generates a signal of logical high level and a signal of logical low level. For example, in a case where the logical high level is indicated as "1", and the logical low level is indicated as "0", the control signal PHADV, which is a detection signal by the phase detection unit, repeats '101010'. However, in cases of the 3-code dithering, the control signal PHADV repeats '11001100'. Accordingly, the 3-code dithering detection circuit 600 generates the 3-code dithering detection signals HA, HB, HC, HD corresponding to the repetition of the control signal PHADV, '11001100'.

Whether or not the 3-code dithering occurs is determined by a combination of the 3-code dithering detection signals HA, HB, HC, HD, and a logical table thereof is as follows:

| LOGICAL TABLE | | | | |
|---|---|---|---|---|
| | HA | HB | HC | HD |
| 2 code dithering | High | High | Low | Low |
| First 3-code dithering | Low | High | Low | High |
| Second 3-code dithering | High | Low | High | Low |

In a case where the 3-code dithering detection signals HA, HB, HC, HD have the above logical values of the 3-code dithering, these values indicate the 3-code dithering occurrence and so the dithering control circuit is driven to generate the 2 code dithering. The dithering control circuit is shown in FIG. 11.

Figure 11:
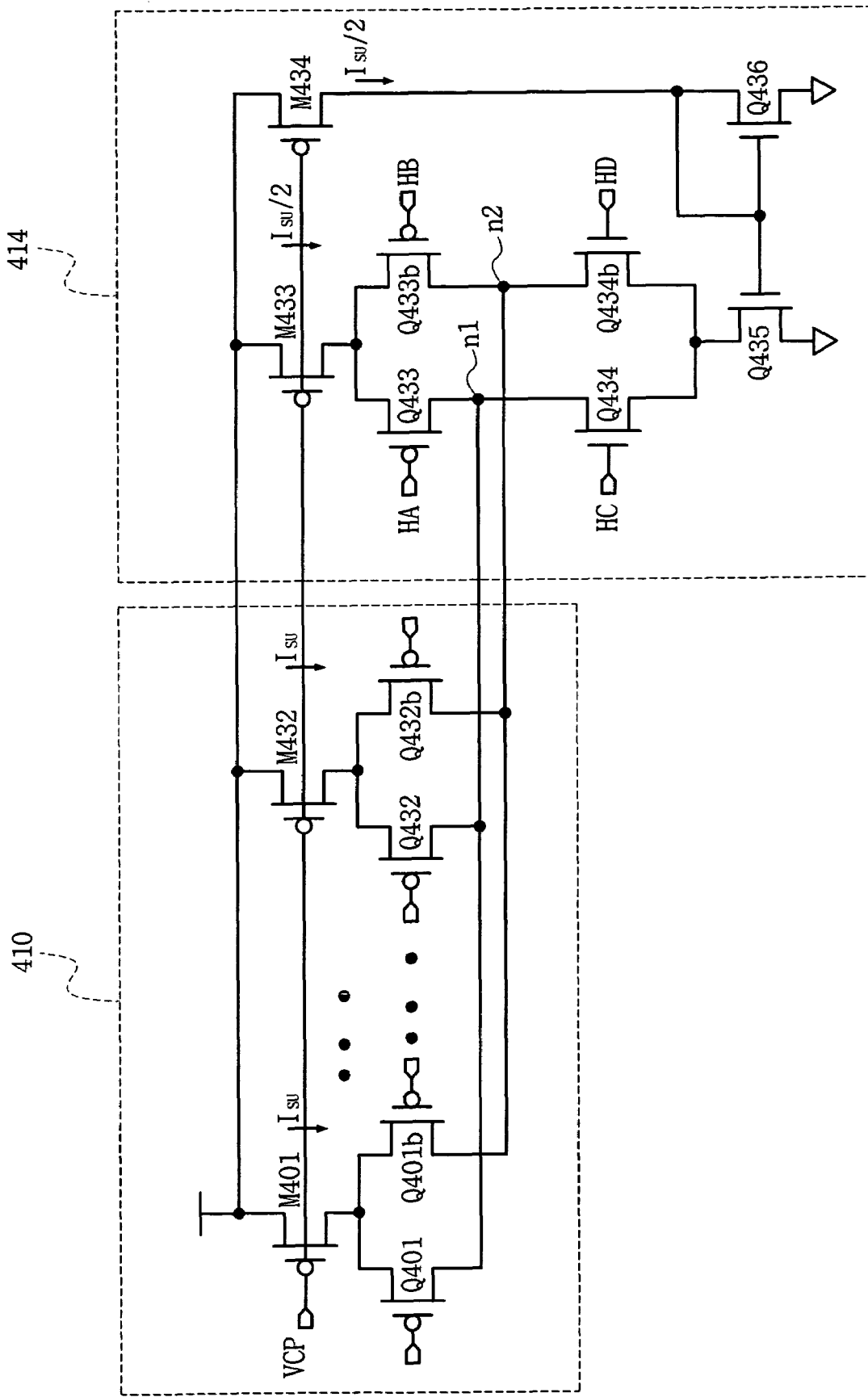
FIG. 11 is a circuit diagram of an exemplary embodiment of a dithering control circuit connected to the load unit of the D/A converter circuit in FIG. 9.

As shown in FIG. 11, the dithering control unit 414 can be connected to the load unit 410 of the D/A converter circuit 400 in FIG. 9. In other words, the dithering control circuit 414 comprises current control devices M433, M434 connected in parallel to the plurality of current control devices M401-M432 constituting the load unit 410. The current control devices M433, M434 are driven by the same control signal VCP as the plurality of the current control devices M401-M432 of the load unit 410, and is configured to have smaller current than current Isu flowing through each of the current control devices M401-M432 of the load unit 410. For example, it is configured to have ½ times the current Isu. Between the first node n1 and the first current control device M433 of the dithering control circuit 414, a first switching device Q433 is positioned which is driven by the dithering detection signal HA. Between the second node n2 and the first current control device M433, a second switching device Q433b is positioned which is driven by the dithering detection signal HB. In addition, it is preferable that the current control devices M433, M434, the first switching device Q433 and the second switching device Q433b are configured with P channel transistors.

The circuit includes a third switching device Q434 of which a terminal is connected to the first node n1, the third switching device driven by a dithering detection signal HC, and the circuit includes a four switching device Q434b of which a terminal is connected to the second node n2, the four switching device driven by a dithering detection signal HD. In addition, the other terminal of the third switching device Q434 and the other terminal of the four switching device Q434b are connected to each other. Preferably, the third switching device Q434 and the four switching device Q434b are N channel transistors. The circuit further comprises an N transistor Q435 positioned between the other terminal of the third switching device Q434 and the ground terminal to constitute a current mirror circuit with an N channel transistor Q436 positioned between the ground terminal and the second current control device M434.

As shown in the above logical table, the dithering control circuit 414 does not operate in cases of 2 code dithering and does operate in cases of 3-code dithering. First, in case the first 3-code dithering occurs, the first current control device Q433 is selected by an operation of the first switching device Q433, and a current amount flowing through the first node n1 increases by Isu/2 (=W*Is/2), thereby changing a level of the first interpolation control signal VCNA.

Accordingly, current which flows through the first current source unit 120 of the interpolation unit 100 of FIG. 7 also increases by Isu/2 (=W*Is/2). In addition, the fourth switching device Q434b is driven, and the current mirror circuit to constitute the dithering control circuit operates, and accordingly a current amount flowing through the second node n2 decreases by Isu/2 (=W*Is/2), thereby changing a level of the second interpolation control signal VCNB. Accordingly, current that flows through the second current source unit 130 of the interpolation unit 100 of FIG. 7 also decreases by Isu/2 (=W*Is/2).

Next, in case the second 3-code dithering occurs, the first current control device Q433 is selected by an operation of the second switching device Q433b, and a current amount flowing through the second node n2 increases by Isu/2 (=W*Is/2), thereby changing a level of the second interpolation control signal VCNB. Accordingly, current that flows through the second current source unit 130 of the interpolation unit 100 of FIG. 7 also increases by Isu/2 (=W*Is/2). In addition, the third switching device Q434 is driven, and the current mirror circuit to constitute the dithering control circuit operates, and accordingly a current amount flowing through the first node n1 decreases by Isu/2 (=W*Is/2), thereby changing a level of the first interpolation control signal VCNA. Accordingly, current which flows through the first current source unit 120 of the interpolation unit 100 of FIG. 7 also decreases by Isu/2 (=W*Is/2). Therefore, a total current amount of the first current source unit 120 and the second current source unit 130 is a uniform amount.

By the operations described above, the current amounts of the current source units 120 and 130 are changed by a half bit, and accordingly a phase of an output signal of the interpolation unit 100 is shifted by ½ times that of the conventional minimum phase, thereby eliminating the 3-code dithering phenomenon.

Figure 12:
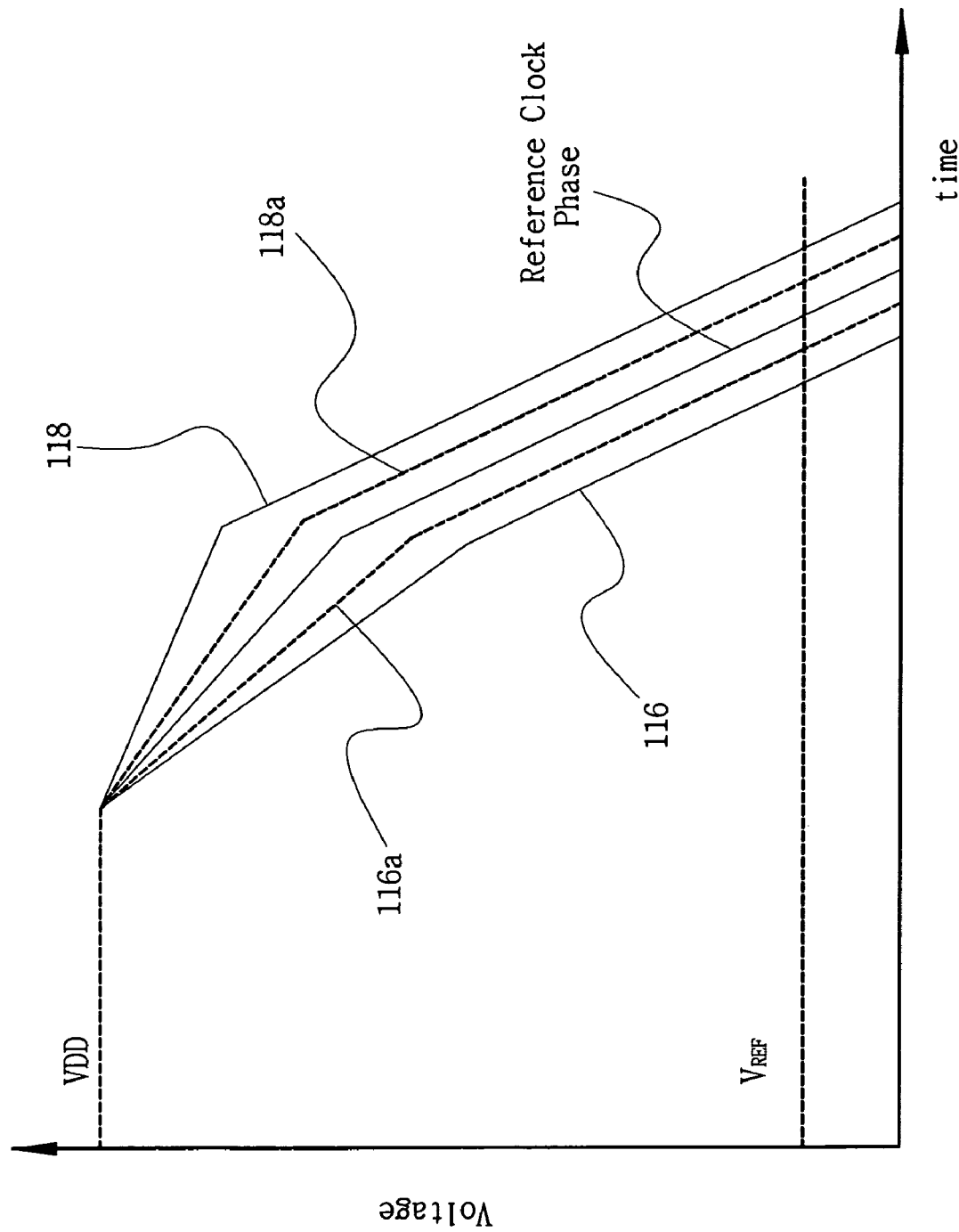
FIG. 12 is a graph showing output signals of the interpolation unit of FIG. 7 which operates with the dithering control circuit of FIG. 11.

FIG. 12 is a graph showing a voltage change of the output signal of the interpolation unit 100 according to time, in a case where the 3-code dithering phenomenon is removed by the operation of the dithering detection circuit. Referring to FIG. 12, when the 3-code dithering occurs in a case where an output signal of the output node of the interpolation unit 100 is a first output signal 116, the dithering detection signals HA, HB, HC, HD generated by the 3-code dithering detection circuit 600 have logical levels at an occurrence of the second 3-code dithering in the above logical table. Accordingly, the 3-code dithering phenomenon is removed through the dithering control circuit 414, and the output signal of the output node OUT of the interpolation unit 100 becomes a second output signal 116a.

In addition, when the 3-code dithering occurs in a case where an output signal of the output node of the interpolation unit 100 is a third output signal 118, the dithering detection signals HA, HB, HC, HD generated by the 3-code dithering detection circuit 600 have logical levels at an occurrence of the first 3-code dithering in the above logical table. Accordingly, the 3-code dithering phenomenon is removed through the dithering control circuit 414, and the output signal of the output node OUT of the interpolation unit 100 becomes a fourth output signal 118a. Through these operations, the 3-code dithering phenomenon is eliminated.

Figure 13:
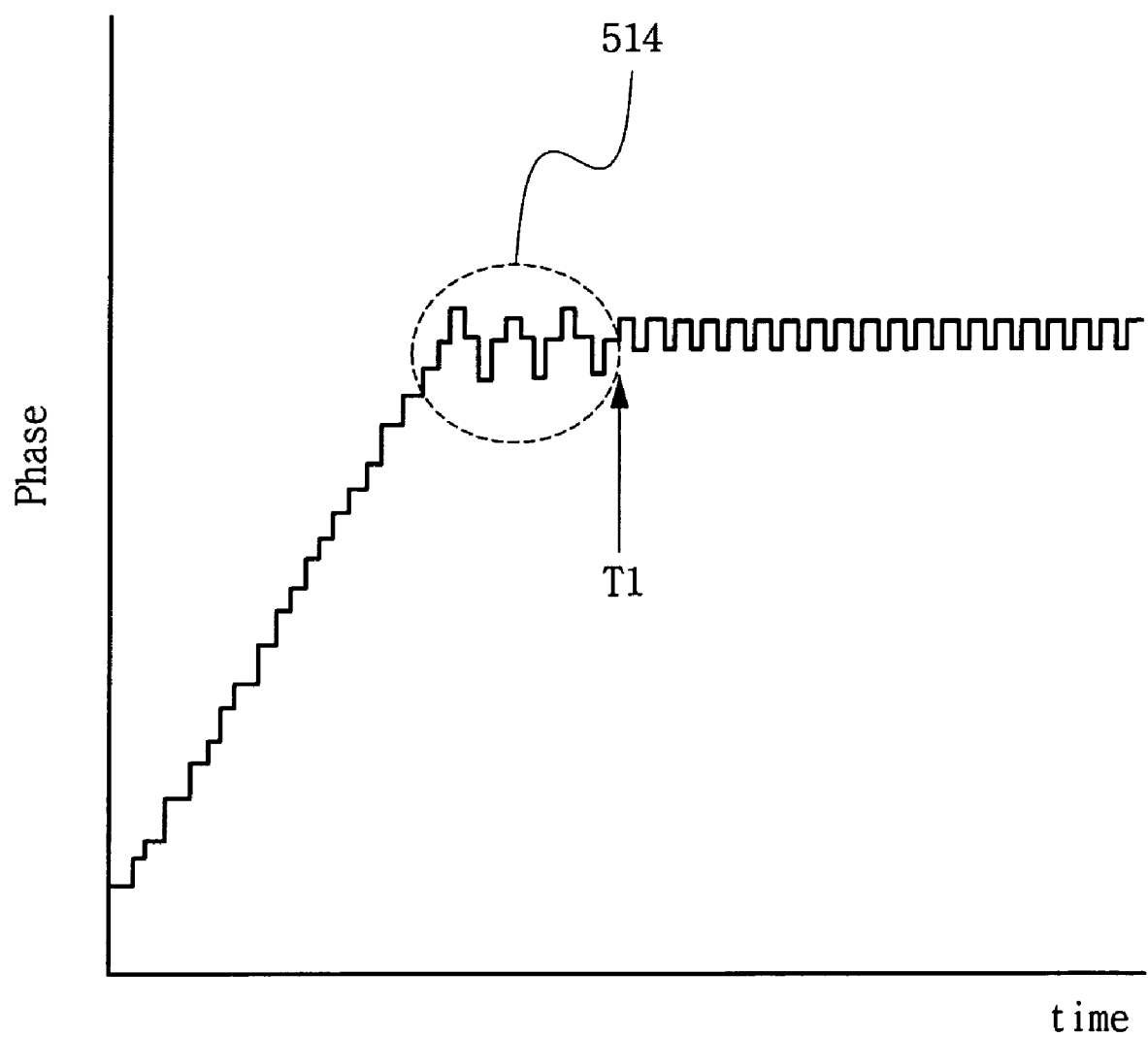
FIG. 13 is a timing diagram showing a phase change of the output signal of the phase detection unit in case of the 3-code dithering according to an exemplary embodiment of the present disclosure.

FIG. 13 is a timing diagram showing a process where the 3-code dithering is generated in the phase detection unit 40 in FIG. 1 and is removed, and shows a phase change according to time during the process. Referring to FIG. 13, in the phase interpolation circuit according to exemplary embodiments of the present disclosure, when the 3-code dithering phenomenon (shown in a circle 514) occurs despite a locking, the dithering detection circuit 600 detects the phenomenon to be eliminated. In other words, the circuit drives the dithering control circuit 414 to eliminate the 3-code dithering phenomenon from a time T1 and to generate the 2 code dithering phenomenon, thereby generating a phase interpolation signal having an exact phase.

As described above, according to various embodiments of the phase interpolation circuit of the present disclosure, the circuit is capable of operating in a low voltage. Further, the circuit is capable of minimizing or reducing an error of phase shift to overcome problems resulting from 3-code dithering.

As described above, according to the phase interpolation circuit of the exemplary embodiments of the present disclosure, it is possible to reduce a capacitive coupling effect according to an input signal by interpositioning the current source between the input and the output. It is also possible to reduce the number of serial transistors and to reduce the number of transistors that operate in a saturation area, thereby being applicable to a circuit capable of operating in a low voltage. Further, it is also possible to eliminate the 3-code dithering phenomenon to generate a phase interpolation signal having an exact phase.

In alternate embodiments, the internal structure of the circuit may be modified and the internal devices may be replaced with other equivalent devices or those providing equivalent functionality. While detailed exemplary embodiments of the present disclosure have been described, various variations may be made to the exemplary embodiments by those of ordinary skill in the pertinent art without departing from the scope of the present invention as defined by the appended claims.

What is claimed is:

1. A phase interpolation circuit configured to output a phase interpolation signal having a phase between phases of at least two input signals, comprising:
   an interpolation unit configured to discharge an output node by a first interpolation control signal in case a first input signal of two input signals having different phases is inputted to the interpolation unit when the output node has been precharged to a power supply voltage level, the interpolation unit additionally discharging the output node by a second interpolation control signal in case of input of a second input signal of the two input signals;

a comparison unit for comparing a reference voltage level and a voltage level of the output node of the interpolation unit to output a signal corresponding to the comparison; and a short pulse generation unit for generating a short pulse in response to an output signal of the comparison unit if the voltage level of the output signal is not higher than the reference voltage level, wherein the interpolation unit comprises a precharge unit for precharging the output node to a power supply voltage level VDD in case the first input signal or the second input signal is not applied, a first current source unit driven by a first interpolation control signal to discharge the output node when the first input signal is applied, and a second current source unit driven by a second interpolation control signal to discharge the output node when the second input signal is applied, and wherein a sum of a current amount of the first current source and a current amount of the second current source is a uniform amount.

2. The circuit according to claim 1, wherein the first interpolation control signal and the second interpolation control signal vary in inverse proportion to each other.

3. The circuit according to claim 1, wherein the first current source unit comprises two serial transistors connected between the output node and a ground terminal; and one transistor of the two transistors which is connected to the output node operates as a current source driven by a first interpolation control signal, and the other transistor of the two transistors which is connected to the ground terminal operates when the first input signal is applied, thereby operating as a switch of the current source.

4. The circuit according to claim 1, wherein the second current source unit is connected to the first current source unit in parallel, and the second current source unit comprises two serial transistors between the output node and the ground terminal, and one transistor of the two transistors which is connected to the output node operates as a current source driven by a second interpolation control signal, and the other transistor of the two transistors which is connected to the ground terminal operates as a switch of the current source when the second input signal is applied.

5. The circuit according to claim 1, further comprising a D/A converter circuit for generating the first interpolation control signal and the second interpolation control signal in response to control code signals.

6. The circuit according to claim 5, the D/A converter comprising:

a load unit configured to uniformly divide the total current into several sub currents by a plurality of current control devices through which currents of the same value flow, and configured to select a predetermined number of the plurality of current control devices by the switching devices for responding to a first control code signal among the control code signals, thereby controlling current flowing through a first node, and configured to select current control devices which are not selected by the first control code signal, by the plurality of switching devices for responding to the second control code signal which is a complementary signal to the first control code signal, thereby controlling current flowing through a second node; and a signal generation unit having a first interpolation control signal generation unit for generating the first interpolation control signal corresponding to current flowing through the first node, and a second interpolation control signal generation unit for generating the second interpolation control signal corresponding to current flowing through the second node.

7. A phase interpolation circuit configured to output a phase interpolation signal having a phase between phases of at least two input signals, comprising:

an interpolation unit configured to discharge an output node by a first interpolation control signal in case a first input signal of two input signals having different phases is inputted to the interpolation unit when the output node has been precharged to a power supply voltage level, the interpolation unit additionally discharging the output node by a second interpolation control signal in case of input of a second input signal of the two input signals;

a comparison unit for comparing a reference voltage level and a voltage level of the output node of the interpolation unit to output a signal corresponding to the comparison;

a short pulse generation unit for generating a short pulse in response to an output signal of the comparison unit; and a D/A converter circuit for generating the first interpolation control signal and the second interpolation control signal in response to control code signals, the D/A converter including a signal generation unit having a first interpolation control signal generation unit for generating the first interpolation control signal corresponding to current flowing through the first node, and a second interpolation control signal generation unit for generating the second interpolation control signal corresponding to current flowing through the second node, wherein the first interpolation control signal generation unit of the signal generation unit of the D/A converter and the first current source unit of the interpolation unit constitutes a current mirror circuit; and the second interpolation control signal generation unit and the second current source unit of the interpolation unit constitutes a current mirror circuit.

8. The circuit according to claim 7, further comprising a 3-code dithering detection circuit for detecting a 3-code dithering to generate a dithering detection signal.

9. The circuit according to claim 8, further comprising a dithering control circuit configured to respond to the dithering detection signal generated by the 3-code dithering detection circuit, and configured to control current amounts of the first node and the second node to be smaller value than current flowing through any one of the current control devices of the D/A converter circuit, thereby controlling the first interpolation control signal and the second interpolation control signal.

10. The circuit according to claim 9, wherein the dithering control circuit is connected to the load unit of the D/A converter circuit.

11. The circuit according to claim 10, wherein each of the current control devices of the D/A converter have 2 times more current flowing through the current control device of the dithering control circuit.

12. A method for generating a phase interpolation signal having a phase between phases of at least two input signals, comprising steps of:

precharging a node to a power supply voltage level when the input signals are not inputted;

discharging the node through a first current source for controlling current by a first interpolation control signal in case a first input signal of the two input signals is inputted to the interpolation unit; and discharging the node through the first current source and a second current source for controlling current by a second interpolation control signal in case of input of a second input signal of the two input signals; and comparing a reference voltage level and a voltage level of the node to generate a corresponding short pulse, thereby generating an interpolation signal, wherein the short pulse is generated in case the voltage level of the node is not higher than the reference voltage level, wherein a sum of a current amount of the first current source and a current amount of the second current source is a uniform amount.

13. The method according to claim 12, further comprising a step of detecting a 3-code dithering to generate a corresponding dithering detection signal.

14. The method according to claim 13, further comprising a step of controlling a discharge time of the node and changing a phase of an output signal of the node by responding to a dithering detection signal to control the first interpolation control signal and the second interpolation control signal and to change current amounts of the first current source and the second current source.

15. A phase interpolation circuit comprising:

an interpolation unit having first and second interpolation input nodes, first and second interpolation control nodes, and an interpolation output node;

a comparison unit in signal communication with the interpolation unit having a comparison reference voltage node, a comparison input node coupled to the interpolation output node of the interpolation unit, and a comparison output node;

a short pulse generation unit in signal communication with the comparison unit having a short pulse input node coupled to the comparison output node, the short pulse generation unit for generating a short pulse if the voltage level of the comparison output node is not higher than the reference voltage node;

a precharge unit in signal communication with the interpolation output node and a power supply voltage;

a first current source unit in signal communication with the first interpolation control node; and a second current source unit in signal communication with the second interpolation control node, wherein a sum of a current amount of the first current source and a current amount of the second current source is a uniform amount.

16. A circuit as defined in claim 15, further comprising at least one of:

a D/A converter circuit in signal communication with the interpolation unit;

a load unit in signal communication with the interpolation unit; or a 3-code dithering detection circuit in signal communication with the interpolation unit.

* * * * *